United States Patent
Sasayama

(10) Patent No.: US 8,953,353 B2
(45) Date of Patent: Feb. 10, 2015

(54) POWER CONVERTER

(75) Inventor: Shinya Sasayama, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/983,831

(22) PCT Filed: Feb. 10, 2011

(86) PCT No.: PCT/JP2011/052888
§ 371 (c)(1),
(2), (4) Date: Aug. 6, 2013

(87) PCT Pub. No.: WO2012/108036
PCT Pub. Date: Aug. 16, 2012

(65) Prior Publication Data
US 2013/0314966 A1    Nov. 28, 2013

(51) Int. Cl.
H02M 1/00    (2006.01)
H05K 7/20    (2006.01)
H02M 7/00    (2006.01)
H01L 23/473  (2006.01)

(52) U.S. Cl.
CPC ............ H05K 7/2089 (2013.01); H02M 7/003 (2013.01); H05K 7/20927 (2013.01); H01L 23/473 (2013.01)
USPC .......................................... 363/147; 361/699

(58) Field of Classification Search
USPC .......................................... 363/147; 361/699
See application file for complete search history.

(56) References Cited

U.S. PATENT DOCUMENTS

| | | | | |
|---|---|---|---|---|
| 6,166,937 A * | 12/2000 | Yamamura et al. | ........... | 363/146 |
| 6,414,867 B2 * | 7/2002 | Suzuki et al. | ................. | 363/141 |
| 6,525,472 B2 * | 2/2003 | Okugi | ............................ | 313/607 |
| 7,652,902 B2 * | 1/2010 | Hattori et al. | ................. | 363/147 |
| 7,724,523 B2 * | 5/2010 | Ishiyama | ...................... | 361/699 |
| 7,978,473 B2 * | 7/2011 | Campbell et al. | ............. | 361/699 |
| 2001/0033477 A1 | 10/2001 | Inoue et al. | | |
| 2002/0024120 A1 | 2/2002 | Yoshimatsu et al. | | |
| 2006/0007720 A1 * | 1/2006 | Pfeifer et al. | ................. | 363/141 |

FOREIGN PATENT DOCUMENTS

| | | | |
|---|---|---|---|
| JP | 2002-76257 A | 3/2002 | |
| JP | 2002083915 A | 3/2002 | |
| JP | 2004247684 A | 9/2004 | |
| JP | 2007-266527 A | 10/2007 | |

* cited by examiner

*Primary Examiner* — Jue Zhang
(74) *Attorney, Agent, or Firm* — Sughrue Mion, PLLC

(57) ABSTRACT

A power converter including a cooler having a cooling flow path in which a refrigerant flows, a base plate to which switching elements are attached, a control circuit board on which power-generating elements are attached, and securing pins that secure the base plate onto the lower cooler wall of the cooler and support the control circuit board so as to be spaced apart from the base plate. Upper end parts of the securing pins pass through the base plate and the cooler lower wall, reaching inside the cooling flow path. First pass-through parts of the securing pins for the lower cooler wall are fitted by pressure into the lower cooler wall . Support column parts of the securing pins extend in a direction opposite the lower cooler wall, and the control circuit board is secured to lower flanges thereof.

18 Claims, 3 Drawing Sheets

POWER CONVERTER

TECHNICAL FIELD

The present invention relates to the structure of a power converter.

BACKGROUND ART

Many electric drive vehicles, such as hybrid electric vehicles and electric cars, are propelled by motors when DC/DC converters boost DC power output by a low-voltage batteries, of about 200 V, and an inverter converts the thus-obtained high-voltage DC power into three-phase electric power, which is in turn used to drive the motors. The types of DC/DC converters frequently employed are ones that accumulate, in reactors, DC power supplied by low-voltage batteries, and employ switching elements, such as IGBTs, to switch accumulated electric power to raise voltages. Since the switching elements generate much heat, there has been proposed an example method according to which a base plate, to which switching elements are fixed, is mounted on a radiator, for which radiator fins are provided, so that heat generated by the switching elements is dissipated to cool the switching elements (see, for example, Patent Document 1).

In addition to switching elements that generate much heat, the DC/DC converter also requires power-generating elements, such as a coil, a transformer, and a capacitor, and a control element that controls the operation of the switching elements.

Since the use of switching elements is accompanied by the generation of much heat, generally, the switching elements are arranged on a cooler through which cooling water flows, and a control circuit board, on which a control element and power generating elements are mounted, is arranged above the cooler, at a distance from and parallel to a base plate, by means of a plurality of support columns that are provided on the cooler in order to reduce the size of the DC/DC converter (see, for example, Patent Document 2). In this arrangement, since the base plate and the control circuit board are arranged as two layers, above the cooler, the installation space can be reduced. Furthermore, with this arrangement, heat generated by the control circuit board can be transferred to the cooler via the plurality of support columns, and therefore, the switching elements and the individual power generating elements mounted on the control circuit board can be cooled. Moreover, according to Patent Document 1, previously described, the control circuit board is fixed to bosses, provided for the base plate, so as to arrange the switching elements and the control circuit board as two layers, and as a result, a saving in space is obtained.

CITATION LIST

Patent Documents

Patent Document 1: Japanese Patent Laid-Open No. 2002-076257
Patent Document 2: Japanese Patent Laid-Open No. 2007-266527

SUMMARY OF INVENTION

Technical Problem

According the structure of prior art described in Patent Document 2, wherein the support columns attached to the cooling plate are employed to support the control circuit board, the support columns are provided on the cooler on the periphery of the base plate on which the switching elements are mounted, and therefore, there is a problem in that the size of the DC/DC converter is increased. Further, for the power module structure described in the prior art of Patent Document 1, since the control circuit board is fixed onto the bosses provided for the base plate, space on the base plate for arranging the switching elements is limited, and when large switching elements or many switching elements are to be arranged on the base plate, a problem has been encountered in that the size of the base plate, or of the entire DC/DC converter, would be increased.

When the size and the capacity of the switching elements become greater, an increased amount of current flows through the power-generating elements and the control element mounted on the control circuit board, and the generation of heat is increased. In order to dissipate heat generated by the control circuit board for the prior art described in Patent Document 1 or Patent Document 2, more bosses or support columns must be provided, and a path for heat dissipation from the control circuit substrate to the cooler must be expanded. For such heat dissipation, bosses and support columns must be arranged not only on the periphery of the base plate, but also in the center of the base plate, for example. Therefore, the area of the base plate required for arranging the bosses or the support columns is increased, while the space provided for arranging the switching elements is reduced, and as a result, there is a problem in that the base plate becomes larger, and the DC/DC converter is increased in size.

One objective of the present invention is to provide a compact power converter having a simple structure.

Means for Solving the Problem

A power converter according to the present invention includes a cooler having a cooling flow path, through which a refrigerant flows, a base plate, on which switching elements are mounted; a control circuit board, on which power-generating elements are mounted, and securing pins, which securely fix the base plate to a cooling flow path wall of the cooler, and also support the control circuit board a distance from the base plate, is characterized in that: one end of each of the securing pins passes through the base plate and the cooling flow path wall, and reaches inside the cooling flow path, and a part of the securing pin that passes through the cooling flow path wall is fastened to the cooling flow path wall; and the other end of each of the securing pins is extended to a side opposite to the cooling flow path wall, and the control circuit board is fixed to a distal end of the securing pin.

For the power converter of this invention, it is suitable that the power converter be mounted on a transaxle, and it is appropriate that the part of each of the securing pins that passes through the cooling flow path wall be fitted by pressing into the cooling flow path wall; and it is furthermore appropriate that the part of each of the securing pins that passes through the cooling flow path wall be screwed in and secured to the cooling flow path wall, and it is suitable that the power converter be a DC/DC converter.

For the power converter of the present invention, it is also appropriate that the base plate and the control circuit board of the power converter be arranged between the transaxle and the cooler. Furthermore, it is appropriate that the control circuit board be fixed to the distal ends of the securing pins by means of bolts that pass through the control circuit board.

Advantageous Effects of Invention

The present invention provides effects such that the power converter can be reduced in size by means of a simple structure.

DESCRIPTION OF EMBODIMENTS

Figure 1:
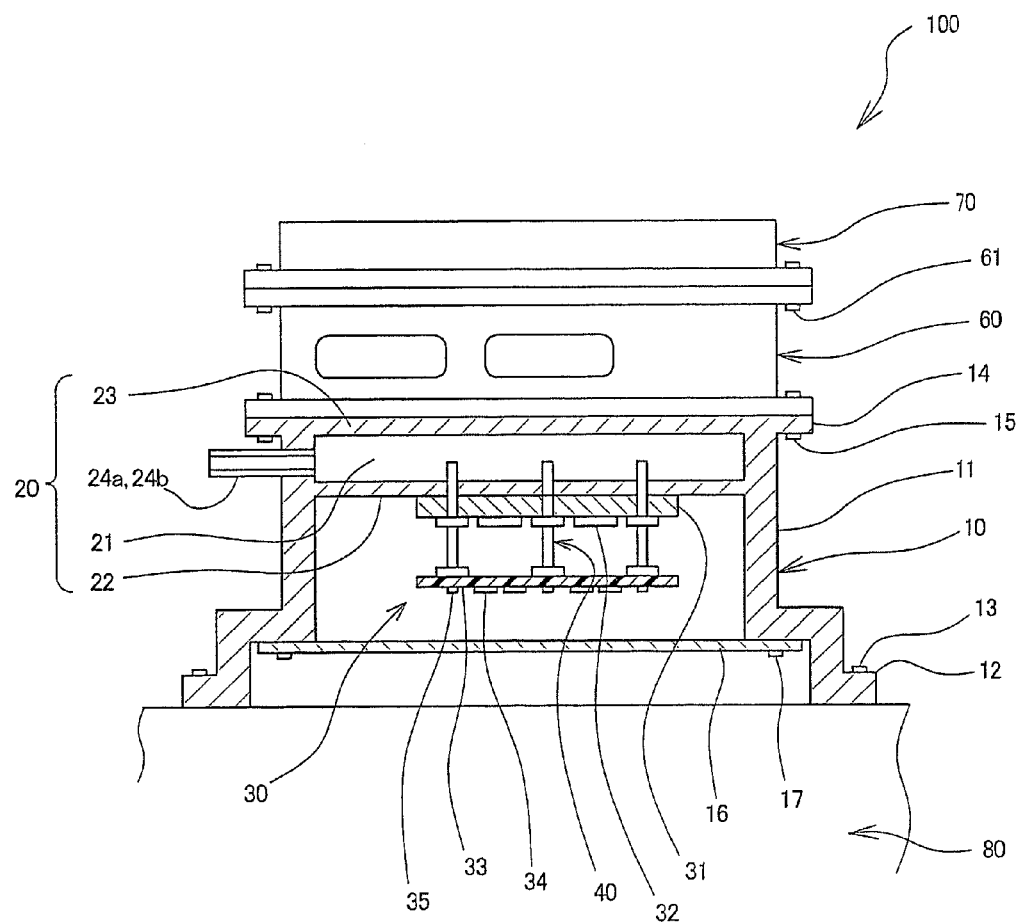
FIG. 1 is an explanatory diagram illustrating the general structure of a power converter according to one embodiment of the present invention.

The embodiments of the present invention will now be described by reference to the drawings. As shown in FIG. 1, a power converter 100 of one embodiment of the present invention is an integrated unit provided by stacking three cases; i.e., a lower case 10, a center case 60, and an upper case 70, and fastening these cases with bolts 15 and 61. A lower flange 12 of the lower case 10 is secured to the top of a transaxle 80 with bolts 13.

A cooler 20 is provided for the upper portion of the lower case 10. The cooler 20 includes: a cooling flow path 21, which is enclosed by a lower cooler wall 22, an upper cooler wall 23, and side walls 11 of the lower case 10; a refrigerant inlet port 24a, through which a refrigerant is to be introduced into the cooling flow path 21; and a refrigerant outlet port 24b, through which the refrigerant is discharged from the cooling flow path 21. The lower cooler wall 22 is a cooling flow path wall. A base plate 31 on whose surface switching elements 32 are mounted is fixed to the lower face of the lower cooler wall 22 by means of securing pins 40. The upper distal ends of the securing pins 40 are extended to the inside of the cooling flow path 21. A control circuit board 33 where power-generating elements 34, such as a coil and a capacitor, are mounted is fixed to the lower faces of the securing pins 40. One part of the switching elements 32 and the control circuit board 33 constitute a DC/DC converter 30. Between the control circuit board 33 and the transaxle 80, an under cover 16 is attached by bolts 17 in order to block heat generated by the transaxle 80, and to prevent entry of a foreign substance into the lower case 10. Further, as shown in FIG. 2(a), the control circuit board 33 is fixed to the lower faces of the securing pins 40 by means of bolts 35 that penetrate the control circuit board 33.

Figures 2A, 2B:
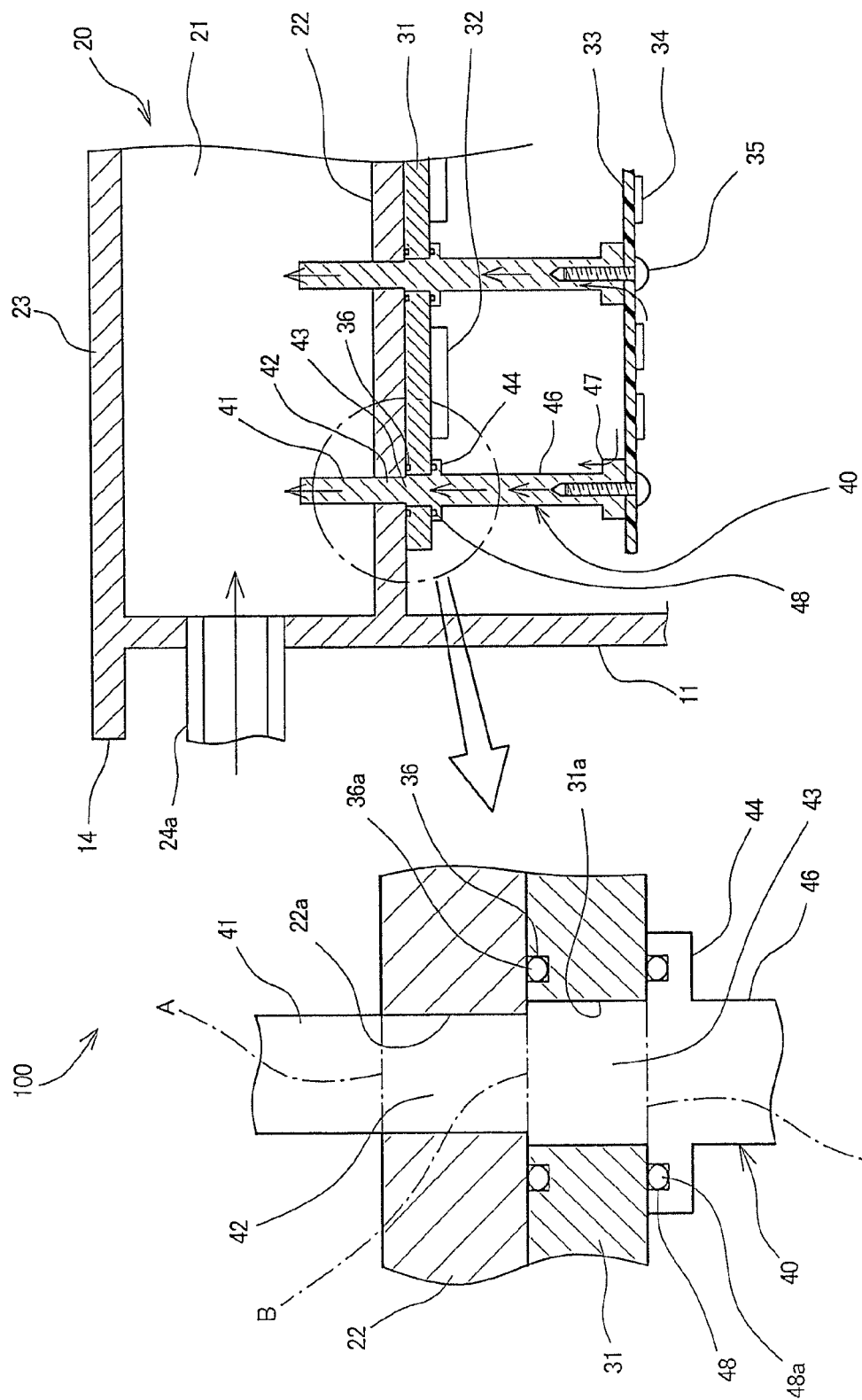
FIG. 2 is an explanatory diagram illustrating a partial cross section of the power converter according to the embodiment of the present invention.

As shown in FIG. 2(a), the securing pins 40 each include an upper end part 41 that projects into the interior of the cooling flow path 21; a first pass-through part 42 that passes through the lower cooler wall 22; a second pass-through part 43 that passes through the base plate 31; an upper flange 44 that has a larger diameter than the first and second pass-through parts 42 and 43; a support column part 46 that has a smaller diameter than the upper flange 44, and extends downward from the upper flange 44; and a lower flange 47 that is provided at the lower end of the support column part 46 and has a larger diameter than the support column part 46.

As shown in FIG. 2(b), the first pass-through part 42 of the securing pin 40, defined by a chain line A and a chain line B, passes through a hole 22a that is formed in the lower cooler wall 22. The outer diameter of the first pass-through part 42 is greater than the inner diameter of the hole 22a so as to provide a press fit, and the first pass-through part 42 of the securing pin 40 is fitted by pressing into the hole 22a. Further, the second pass-through part 43 of the securing pin 40, defined by the chain line B and a chain line C, passes through a hole 31a formed in the base plate 31. The outer diameter of the second pass-through part 43 is greater than that of the first pass-through part 42, and a step is formed between the first pass-through part 42 and the second pass-through part 43. Furthermore, as well as for the first pass-through part 42, the outer diameter of the second pass-through part 43 is larger than the inner diameter of the hole 31a to provide a press fit, and similarly to the first pass-through part 42, the second pass-through part 43 of the securing pin 40 is fitted by pressing into the hole 31a. The upper flange 44 of the securing pin 40 is provided so that the outer diameter thereof is larger than the inner diameters of the second pass-through part 43 and the hole 31a, and the upper face closely contacts the lower face of the base plate 31. Moreover, an annular groove 36 is formed in the face of the base plate 31 around the hole 31a on the lower cooler wall 22 side, and an O-ring 36a is fitted in the groove 36. Similarly, an annular groove 48 is formed in the face of the upper flange 44 of the securing pin 40 on the base plate side, and an O-ring 48a is fitted in the groove 48. When the securing pin 40 is pushed into the base plate 31 and the lower cooling wall 22 and the first pass-through part 42 is securely fitted in the lower cooler wall 22, the base plate 31 is sandwiched between the lower cooler wall 22 and the upper flange 44 of the securing pin 40 and is fixed to the lower face of the lower cooler wall 22. At this time, the O-rings 36a and 48a are squeezed, respectively, between the wall face of the groove 36 and the lower cooler wall 22 and between the wall face of the groove 48 and the base plate 31, so that leakage of the refrigerant from the holes 22a and 31a can be avoided.

When the operation of the power converter 100 with the above described arrangement is begun, heat generated by the switching elements 32 is transferred from the switching elements 32 to the base plate 31 and the lower cooler wall 22, and is discharged outside the power converter 100 by the refrigerant that flows along the cooling flow path 21 of the cooler 20. Further, heat generated by the power-generating elements 34 mounted on the control circuit board 33 is transferred from the power-generating elements, via the control circuit board 33 and the lower faces of the lower flanges 47 of the securing pins 40, and is passed along the support column parts 46 and reaches the upper end parts 41. Since the upper end parts 41 are projected into the interior of the cooling flow path 21, heat that has reached the upper end parts 41 is discharged outside the power converter 100 by the refrigerant. Therefore, in the present embodiment, the control circuit board 33 and the power-generating elements 34 can be cooled more effectively than in the conventional case. Further, since the control circuit board 33 and the power-generating elements 34 can be effectively cooled in this manner, as shown in FIG. 2, the control circuit board 33 of the DC/DC converter 30 can be arranged on the transaxle 80 side to reduce the size of the power converter 100.

Furthermore, since the securing pins 40 of the power converter 100 of this embodiment include a function for fixing the base plate 31 to the lower cooler wall 22 and a function for supporting the control circuit board 33 apart from the base plate 31, there is no requirement for separate arrangement of bolts used to fix the base plate 31 to the lower cooler wall 22 and support columns to support the control circuit board 33.

Figure 3:
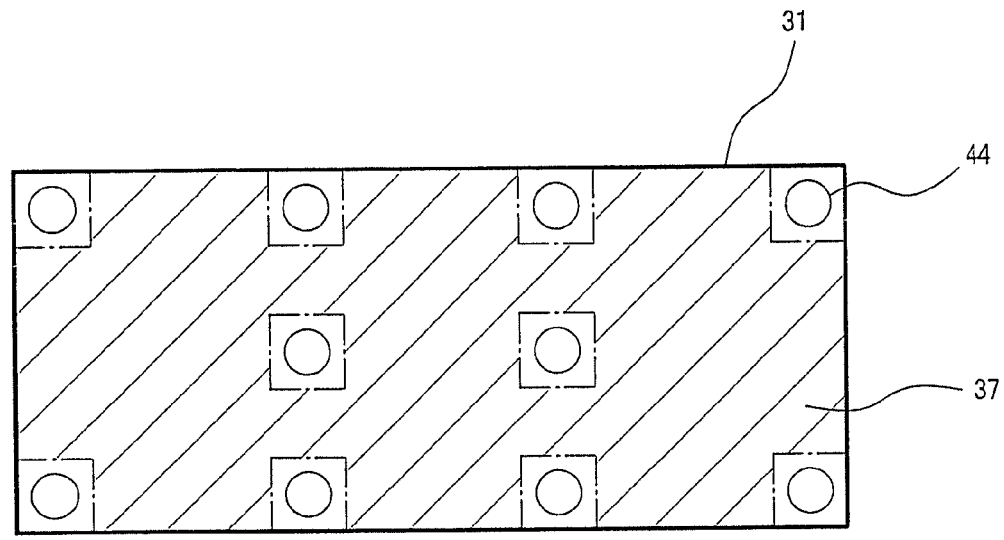
FIG. 3 is a plan view of the switching element mounting available area of the base plate of the power converter according to the embodiment of the present invention.

Therefore, a large area as hatched in FIG. 3 can be prepared as a switching element mounting available area 37, and the power converter 100 can be reduced in size. The switching element mounting available area 37 is an area excluding switching element mounting disabled areas, indicated by chain lines, around the upper flanges 44 of the securing pins 40. Further, in a case wherein the power converter 100 is directly fixed to the transaxle 80, the number of support columns must be increased in order to prevent resonance of the control circuit board 33; however, according to the present embodiment, since the securing pins 40 include a function for fixing the base plate 31 to the lower cooler wall 22 and a function for supporting the control circuit board 33 a distance from the base plate 31, and since also the upper end parts 41 are projected into the interior of the cooling flow path 21, the size of the switching element mounting available area 37 is reduced only slightly, even when the number of securing pins 40 is increased, and further, cooling of the control circuit board 33 and the power-generating elements 34 can be more effectively performed by increasing the number of securing pins 40.

At the time of maintenance for the power converter 100 of the present embodiment, the bolts 13 used to fix the lower case 10 to the transaxle 80 are removed so as to separate the entire power converter 100 from the transaxle 80, and thereafter, the bolts 17 are removed from the lower face to separate the under cover 16, and the bolts 35 used to fix the control circuit board 33 are removed, so that replacement of the control circuit board 33 of the DC/DC converter 30 can be easily performed. Specifically, it is not required that the center case 60 and the upper case 70, where the control circuit board, etc., of the inverter, are stored, be disassembled in the named order, beginning from the top; the entire power converter 100 need simply be removed from the transaxle 80, and be turned over, so that the control circuit board 33 of the DC/DC converter 30 can be easily exchanged. Further, since the center case 60 and the upper case 70, where the control circuit board, etc., of the inverter are stored, need not be disassembled, entry of foreign substances into these cases during the performance of maintenance can be prevented.

In the above described embodiment, the first and second pass-through parts 42 and 43 of the securing pins 40 are fitted, by pressure, into the holes 22a in the lower cooler wall 22 and the holes 31a in the base plate 31, respectively; however, the first pass-through parts 42 may be fitted into the holes 22a by pressure, while the second pass-through parts 43 may be inserted into the holes 31a with a gap relative to the holes 31a.

Figure 4:
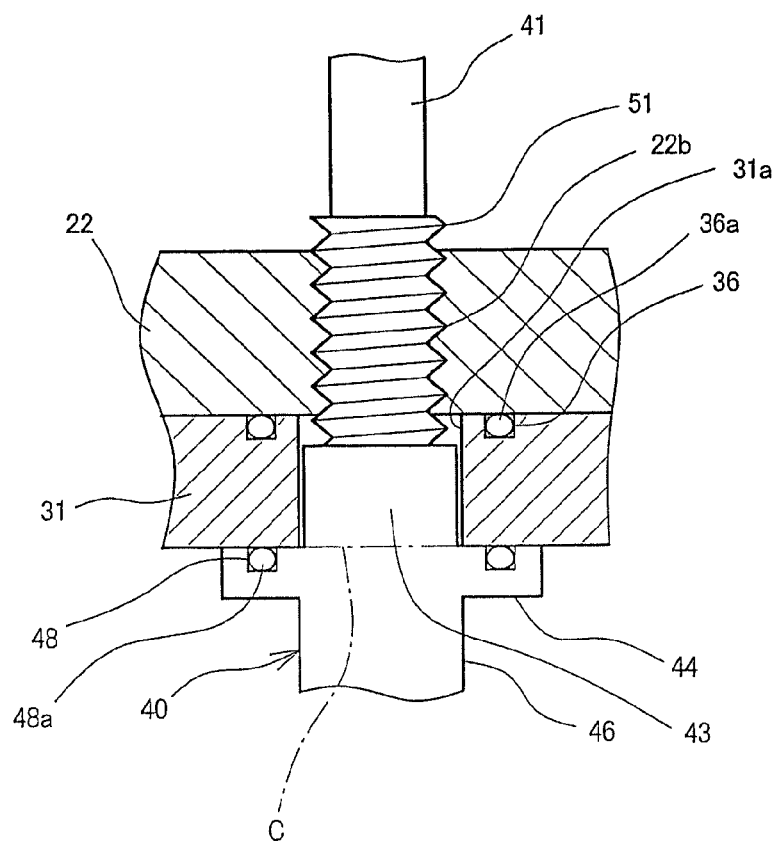
FIG. 4 is an explanatory diagram illustrating the state, for a power converter according to another embodiment of the present invention, wherein a securing pin is fitted to the wall of a cooling flow path wall.

Another embodiment of the present invention will now be described by reference to FIG. 4. The reference numerals provided for the embodiment described by reference to FIGS. 1 to 3 are also employed to denote corresponding portions, and no further explanation for them will be given. The embodiment shown in FIG. 4 employs a structure wherein the first pass-through parts 42 of the embodiment, described by reference to FIG. 2(b), are employed as threaded parts 51, the holes 22a of the lower cooler wall 22 are employed as screw holes 22b, and the diameter of holes 31a of a base plate 31 is slightly larger than the diameter of second pass-through parts 43 in order to obtain a small gap between the holes 31a and the second pass-through parts 43. Furthermore, as shown in FIG. 4, in this embodiment, the diameter of the upper end parts 41 of securing pins 40 are set smaller than the root diameter of the threaded parts 51.

In the present embodiment, the threaded parts 51 of the securing pins 40 are fitted by pressure into the screw holes 22b of the lower cooler wall 22, the base plate 31 is fixed by being sandwiched between the lower cooler wall 22 and upper flanges 44 of the securing pins 40, and the O-rings 36a and 48a are squeezed, so that the leakage of a refrigerant through the screw holes 22b can be prevented.

The present embodiment provides the same effects as those obtained in the embodiment previously described by reference to FIGS. 1 to 3. Moreover, in the present embodiment, not only can replacement of a control circuit board 33 be easily performed, but also the base plate 31 can be removed by disengaging the securing pins 40, and therefore, in a case wherein switching elements 32 have malfunctioned, the exchange of the switching elements 32 can be easily performed without disassembling the center case 60 and the upper case 70 wherein an inverter, etc., are stored.

REFERENCE SIGNS LIST

10: lower case
11: side wall
12: lower flange
13, 15, 17, 35, 61: bolt
16: under cover
20: cooler
21: cooling flow path
22: lower cooler wall
22a, 31a: hole
22b: screw hole
23: upper cooler wall
24a: refrigerant inlet port
24b: refrigerant outlet port
30: DC/DC converter
31: base plate
32: switching element
33: control circuit board
34: power-generating element
36, 48: groove
36a, 48a: O-ring
37: switching element mounting available area
40: securing pin
41: upper end part
42: first pass-through part
43: second pass-through part
44: upper flange
46: support column part
47: lower flange
51: threaded portion
60: center case
70: upper case
80: transaxle
100: power converter

The invention claimed is:

1. A power converter, which comprises
a cooler having a cooling flow path, through which a refrigerant flows,
a base plate, on which switching elements are mounted;
a control circuit board, on which power-generating elements are mounted, and
securing pins, which securely fix the base plate to a cooling flow path wall of the cooler, and also support the control circuit board a distance from the base plate, characterized in that:
one end of each of the securing pins passes through the base plate and the cooling flow path wall, and reaches inside the cooling flow path, and a part of the securing pin that passes through the cooling flow path wall is fastened to the cooling flow path wall; and the other end of each of the securing pins is extended to a side opposite to the cooling flow path wall, and the control circuit board is fixed to a distal end of the securing pin.

2. The power converter according to claim 1, characterized in that the power converter is mounted on a transaxle.

3. The power converter according to claim 1, characterized in that the part of each of the securing pins that passes through the cooling flow path wall is fitted by pressure into the cooling flow path wall.

4. The power converter according to claim 2, characterized in that the part of each of the securing pins that passes through the cooling flow path wall is fitted by pressure into the cooling flow path wall.

5. The power converter according to claim 1, characterized in that the power converter is a DC/DC converter.

6. The power converter according to claim 2, characterized in that the power converter is a DC/DC converter.

7. The power converter according to claim 4, characterized in that the power converter is a DC/DC converter.

8. The power converter according to claim 2, characterized in that the base plate and the control circuit board of the power converter are arranged between the transaxle and the cooler.

9. The power converter according to claim 4, characterized in that the base plate and the control circuit board of the power converter are arranged between the transaxle and the cooler.

10. The power converter according to claim 7, characterized in that the base plate and the control circuit board of the power converter are arranged between the transaxle and the cooler.

11. The power converter according to claim 1, characterized in that the part of each of the securing pins that passes through the cooling flow path wall is screwed in and secured to the cooling flow path wall.

12. The power converter according to claim 2, characterized in that the part of each of the securing pins that passes through the cooling flow path wall is screwed in and secured to the cooling flow path wall.

13. The power converter according to claim 6, characterized in that the part of each of the securing pins that passes through the cooling flow path wall is screwed in and secured to the cooling flow path wall.

14. The power converter according to claim 8, characterized in that the part of each of the securing pins that passes through the cooling flow path wall is screwed in and secured to the cooling flow path wall.

15. The power converter according to claim 1, characterized in that the control circuit board is fixed to the distal ends of the securing pins by means of bolts that pass through the control circuit board.

16. The power converter according to claim 2, characterized in that the control circuit board is fixed to the distal ends of the securing pins by means of bolts that pass through the control circuit board.

17. The power converter according to claim 3, characterized in that the control circuit board is fixed to the distal ends of the securing pins by means of bolts that pass through the control circuit board.

18. The power converter according to claim 12, characterized in that the control circuit board is fixed to the distal ends of the securing pins by means of bolts that pass through the control circuit board.

* * * * *